United States Patent
Sewell

(10) Patent No.: US 7,363,854 B2
(45) Date of Patent: Apr. 29, 2008

(54) SYSTEM AND METHOD FOR PATTERNING BOTH SIDES OF A SUBSTRATE UTILIZING IMPRINT LITHOGRAPHY

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 205 days.

(21) Appl. No.: 11/224,316

(22) Filed: Sep. 13, 2005

(65) Prior Publication Data
US 2006/0131785 A1 Jun. 22, 2006

Related U.S. Application Data

(63) Continuation-in-part of application No. 11/012,598, filed on Dec. 16, 2004.

(51) Int. Cl.
*G03F 7/00* (2006.01)
(52) U.S. Cl. .................. 101/41; 264/408; 264/293; 264/313; 425/406; 430/322; 430/330
(58) Field of Classification Search ............. 264/408, 264/293, 320, 339, 313, 316; 101/32, 41, 101/130, 131; 425/174.6, 406; 430/20, 430/22, 322, 5, 323, 330
See application file for complete search history.

(56) References Cited

U.S. PATENT DOCUMENTS

| | | | |
|---|---|---|---|
| 5,669,303 A | 9/1997 | Maracas et al. | |
| 5,772,905 A | 6/1998 | Chou | |
| 6,238,271 B1 | 5/2001 | Cesna | |
| 6,365,059 B1 | 4/2002 | Pechenik | |
| 6,399,173 B1 | 6/2002 | Nagayama et al. | |
| 6,482,742 B1 | 11/2002 | Chou | |
| 6,507,456 B1 | 1/2003 | Dinan et al. | |
| 6,518,189 B1 | 2/2003 | Chou | |
| 6,531,202 B1 | 3/2003 | Litvinov et al. | |
| 6,656,021 B2 | 12/2003 | Ota et al. | |

(Continued)

FOREIGN PATENT DOCUMENTS

EP 0 617 457 A2 9/1994

(Continued)

OTHER PUBLICATIONS

Moritz, J. et al., "Patterned Media Made From Pre-etched Wafers: A Promising Route Toward Ultrahigh-Density Magnetic Recording," *IEEE Transactions on Magnetics*, vol. 38, No. 4, pp. 1731-1736 (Jul. 2002).

(Continued)

*Primary Examiner*—Daniel J. Colilla
*Assistant Examiner*—Kevin D. Williams
(74) *Attorney, Agent, or Firm*—Sterne, Kessler, Goldstein & Fox P.L.L.C.

(57) ABSTRACT

Provided are a method and system for imprinting a pattern formed on surfaces of an imprint mask onto a double-sided substrate. A method includes deforming the surfaces of the first and second imprint stamps to produce respective first and second deformed surfaces, each having an arc therein. A Pressure is applied to bring the deformed first and second surfaces into intimate contact with the first and second substrate surfaces, respectively. The applied pressure substantially flattens the deformed surfaces. And to separate the two surfaces, the applied pressure is released.

22 Claims, 13 Drawing Sheets

U.S. PATENT DOCUMENTS

| | | | |
|---|---|---|---|
| 6,740,209 B2 | 5/2004 | Shibamoto et al. | |
| 6,743,368 B2 | 6/2004 | Lee | |
| 6,757,116 B1 | 6/2004 | Curtiss et al. | |
| 6,809,356 B2 | 10/2004 | Chou | |
| 6,814,898 B1 | 11/2004 | Deeman et al. | |
| 6,869,557 B1 | 3/2005 | Wago et al. | |
| 6,951,173 B1* | 10/2005 | Meissl et al. | 101/483 |
| 6,964,793 B2 | 11/2005 | Willson et al. | |
| 2002/0114978 A1 | 8/2002 | Chang et al. | |
| 2003/0017424 A1* | 1/2003 | Park et al. | 430/322 |
| 2003/0091865 A1 | 5/2003 | Chen et al. | |
| 2003/0104316 A1 | 6/2003 | Wang et al. | |
| 2003/0127007 A1 | 7/2003 | Sakurai et al. | |
| 2003/0203319 A1 | 10/2003 | Lee | |
| 2004/0090610 A1* | 5/2004 | Hatakeyama et al. | 355/67 |
| 2004/0101713 A1 | 5/2004 | Wachenschwanz et al. | |
| 2004/0124566 A1 | 7/2004 | Sreenivasan et al. | |
| 2004/0132301 A1 | 7/2004 | Harper et al. | |
| 2004/0146792 A1* | 7/2004 | Nimmakayala et al. | 430/22 |
| 2004/0169441 A1 | 9/2004 | Choi et al. | |
| 2004/0182820 A1 | 9/2004 | Motowakl et al. | |
| 2004/0195202 A1 | 10/2004 | Pechenik | |
| 2004/0197712 A1* | 10/2004 | Jacobson et al. | 430/322 |
| 2004/0202865 A1 | 10/2004 | Homola et al. | |
| 2004/0209123 A1 | 10/2004 | Bajorek et al. | |
| 2004/0211755 A1 | 10/2004 | Yusa et al. | |
| 2005/0116370 A1 | 6/2005 | Ogino et al. | |
| 2005/0118817 A1 | 6/2005 | Fujita et al. | |
| 2005/0130074 A1 | 6/2005 | Krause et al. | |
| 2005/0133954 A1 | 6/2005 | Homola | |
| 2005/0146078 A1* | 7/2005 | Chou et al. | 264/293 |
| 2005/0150862 A1 | 7/2005 | Harper et al. | |
| 2005/0151282 A1 | 7/2005 | Harper et al. | |
| 2005/0151300 A1 | 7/2005 | Harper et al. | |
| 2005/0155554 A1 | 7/2005 | Saito | |
| 2005/0156342 A1 | 7/2005 | Harper et al. | |
| 2005/0158163 A1 | 7/2005 | Harper et al. | |
| 2005/0167847 A1 | 8/2005 | Olsson | |
| 2005/0172848 A1 | 8/2005 | Olsson | |
| 2005/0191418 A1 | 9/2005 | Bletsch et al. | |
| 2005/0212178 A1* | 9/2005 | Nien et al. | 264/408 |
| 2006/0130317 A1 | 6/2006 | Sewell | |
| 2006/0130678 A1 | 6/2006 | Sewell | |
| 2006/0131270 A1 | 6/2006 | Sewell | |
| 2007/0121375 A1 | 5/2007 | Sewell | |

FOREIGN PATENT DOCUMENTS

| | | |
|---|---|---|
| EP | 1 072 954 A2 | 1/2001 |
| WO | WO 01/59523 A1 | 8/2001 |
| WO | WO 02/42844 A2 | 5/2002 |
| WO | WO 02/42844 A3 | 5/2002 |
| WO | WO 02/091460 A2 | 11/2002 |
| WO | WO 02/091460 A3 | 11/2002 |
| WO | WO 03/099463 A2 | 12/2003 |
| WO | WO 03/099463 A3 | 12/2003 |
| WO | WO 2004/013697 A2 | 2/2004 |
| WO | WO 2004/013697 A3 | 2/2004 |
| WO | WO 2004/021083 A1 | 3/2004 |
| WO | WO 2004/099879 A2 | 11/2004 |

OTHER PUBLICATIONS

Non-Final Rejection for U.S. Appl. No. 11/012,489, mailed Oct. 29, 2007.

Requirement for Restriction/Election for U.S. Appl. No. 11/012,474, mailed on Jul. 6, 2007.

First Non-Final Rejection for U.S. Appl. No. 11/012,489, mailed on Dec. 19, 2006.

Final Rejection for U.S. Appl. No. 11/012,489, mailed on Jun. 15, 2007.

Non-Final Rejection for U.S. Appl. No. 11/012,598, mailed on Feb. 24, 2006.

Second Final Rejection for U.S. Appl. No. 11/012,598, mailed on Sep. 11, 2007.

Second Non-Final Rejection for U.S. Appl. No. 11/012,598, mailed on Mar. 27, 2007.

First Final Rejection for U.S. Appl. No. 11/012,598, mailed Sep. 21, 2006.

International Search Report and Written Opinion for International Application No. PCT/US05/45458 mailed Sep. 4, 2007, 8 pgs.

Notice of Allowability for U.S. Appl. No. 11/288,135, mailed Aug. 6, 2007.

* cited by examiner

SYSTEM AND METHOD FOR PATTERNING BOTH SIDES OF A SUBSTRATE UTILIZING IMPRINT LITHOGRAPHY

CROSS-REFERENCE TO RELATED APPLICATIONS

This application is a continuation-in-part of U.S. application Ser. No. 11/012,598, filed Dec. 16, 2004, which is hereby incorporated by reference in its entirety.

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution can be achieved by using light of shorter wavelength. However, there are problems associated with such reductions. Current systems are starting to adopt optical sources with wavelengths in the 193 nm regime, but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mold or template. The imprintable medium can be the substrate or a material coated on to a surface of the substrate. The imprintable medium can be functional or can be used as a "mask" to transfer a pattern to an underlying surface. The imprintable medium can, for example, be provided as a resist deposited on a substrate, such as a semiconductor material, to which the pattern defined by the template is to be transferred. Imprint lithography is thus essentially a molding process on a micrometer or nanometer scale in which the topography of a template defines the patterns created on a substrate. Patterns can be layered as with optical lithography processes so that in principle imprint lithography could be used for such applications as IC manufacture.

The resolution of imprint lithography is limited only by the resolution of the template fabrication process, for example, imprint lithography has been used to produce features in the sub-50 nm range with significantly improved resolution and line edge roughness compared to that achievable with conventional optical lithography processes. In addition, imprint processes do not require expensive optics, advanced illumination sources, or specialized resist materials typically required by optical lithography processes.

Current imprint lithography processes can have a number of drawbacks particularly with regard to achieving overlay accuracy and high throughput. However, significant improvements in resolution and line edge roughness attainable are from imprint lithography.

A problem which can arise during imprint lithography is that gas bubbles, also known as air inclusions, can be trapped underneath an imprint template during the imprint process. These trapped gas bubbles do not migrate out from beneath the imprint template, but instead stay there for the duration of the imprint process. When the imprint template is removed from the imprintable material (which can be a UV curable resin), an area of the imprinted pattern will be incomplete or otherwise damaged at the location of the gas bubble.

With the traditional used UV curable and thermally deformable resins, separating the stamp from the resin, after imprinting, can be particularly problematic. That is, it is difficult to separate the resin and the stamp in a way that is not impeded by the stamp sticking to the resin, particularly when a vacuum has been used to aid the impress process. Additionally, newer applications for Imprint Stamping require patterning on two sides of the substrate, further complicating the problems noted above.

What is needed, therefore, is a system and method to alleviate the challenge of separating a stamp from the resin after an imprint stamp is used to imprint a pattern into the resin. What is also needed is a system and method enhance the speed of imprint stamping on two sides of the substrate.

SUMMARY

Consistent with the principles of the present invention, as embodied and broadly described herein, the present invention includes a method for imprinting patterns formed on opposing surfaces of first and second imprint stamps onto first and second sides of a substrate, respectively. The method includes deforming the surfaces of the first and second imprint stamps to produce respective first and second deformed surfaces, each having an arc therein. A pressure is applied to bring the deformed first and second surfaces into intimate contact with the first and second substrate surfaces, respectively. The applied pressure substantially flattens the deformed surfaces. And to separate the two surfaces from the respective surfaces of the substrate, the applied pressure is released.

The imprint apparatus of the present invention may print on both sides of a substrate, simultaneously. The apparatus can employ, for example, two stamps, which are aligned to provide registration between top and bottom patterns. The substrate is introduced between the two stamps and is aligned to them. The apparatus has subsystems which provide positioning and alignment of Stamp A, Stamp B, and the substrate. Substrate handling is provided. Temperature and pressure monitoring system are provided. X, Y, Z and Tilt adjustments are provided for stamps and substrate. The imprint apparatus may also be used to print one sides of a substrate first and then print a second side of the substrate.

The stamps have induced bows in their surface to facilitate peel-off and stamp release from the substrate. In one embodiment of the present invention, the imprint apparatus is used for producing patterned media for magnetic data storage. Tracks and Magnetic Domain patterns are aligned and printed on both sides of the data storage platens. One or more embodiments of the present invention are applicable to any imprint lithography process in which a patterned template is imprinted into an imprintable medium in a flowable state, and, for example, can be applied to hot and UV imprint lithography as described above.

In another embodiment of the present invention, a system is provided that comprises a substrate, a carrier, and first and second imprint stamps. The substrate has first and second patterning surfaces and a shaped edge. The carrier has a holding portion that holds the shaped edge of the substrate.

The holding surface has a shape that is complementary to the shaped edge of the substrate, such that the patterning surfaces remain untouched by the carrier. The first and second imprint stamps form patterns on respective ones of the first and second patterning surfaces.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 3:
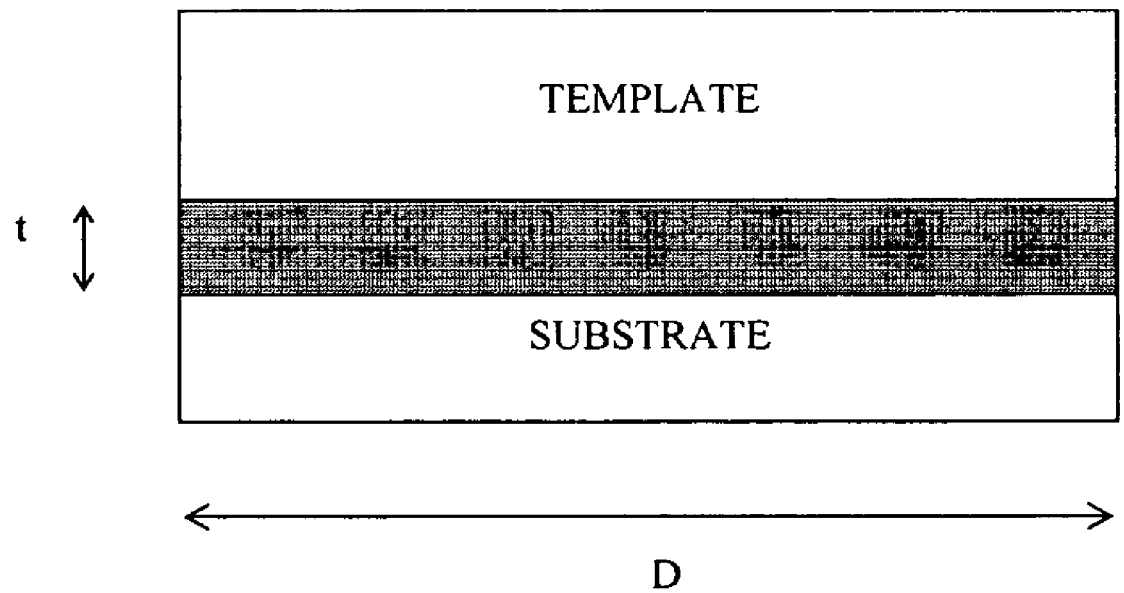

FIG. 3 schematically illustrates a template and a typical imprintable resist layer deposited on a substrate.

Figure 4:
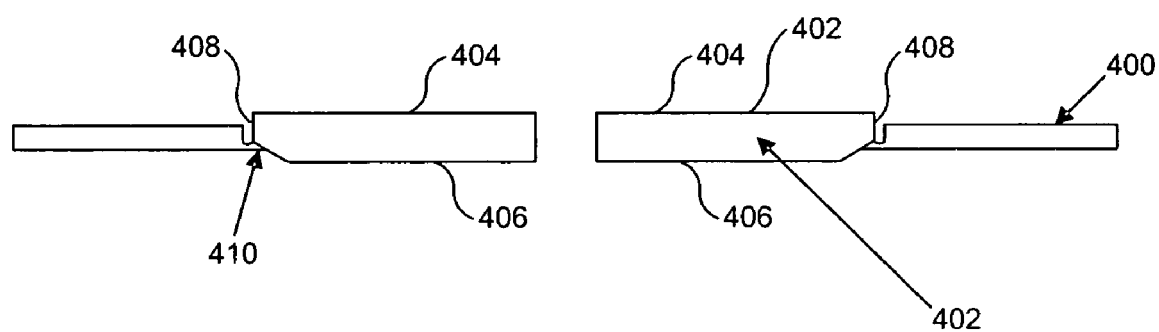

FIG. 4 shows a portion of an imprint lithography system, according to one embodiment of the present invention.

Figure 5:
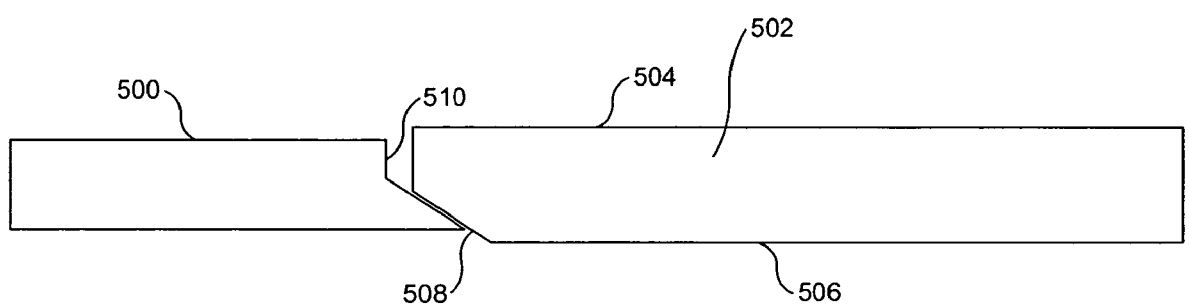
Figure 6:
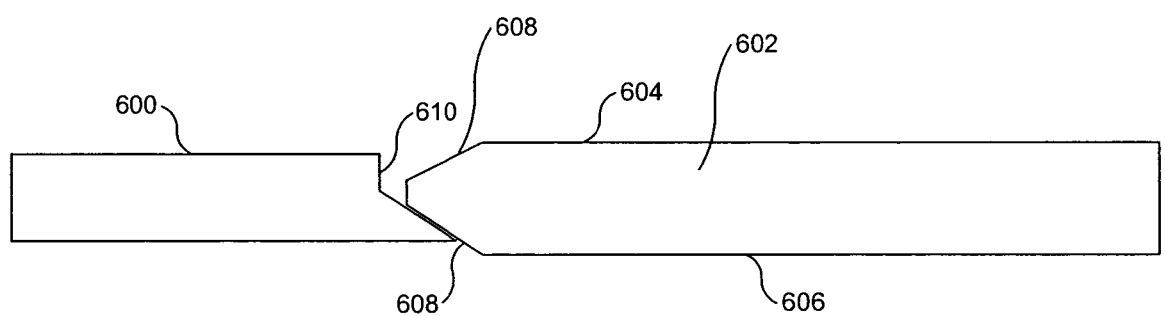
Figure 7:
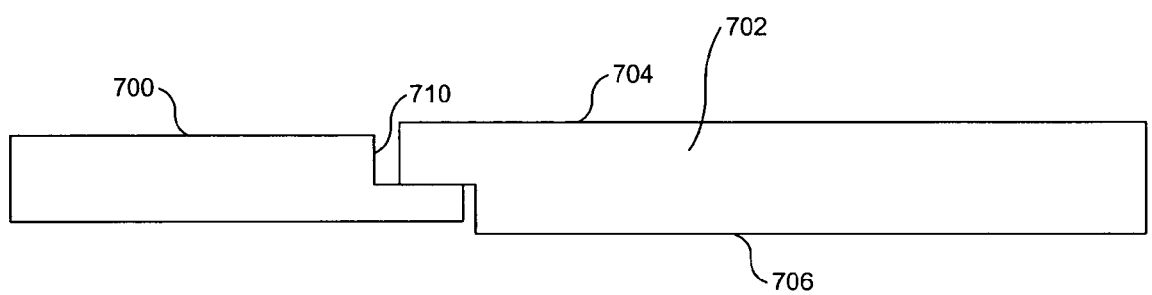

FIGS. 5, 6, and 7 show various complementary shapes for substrate edge and carrier holding portions, according to various embodiments of the present invention.

Figure 8:
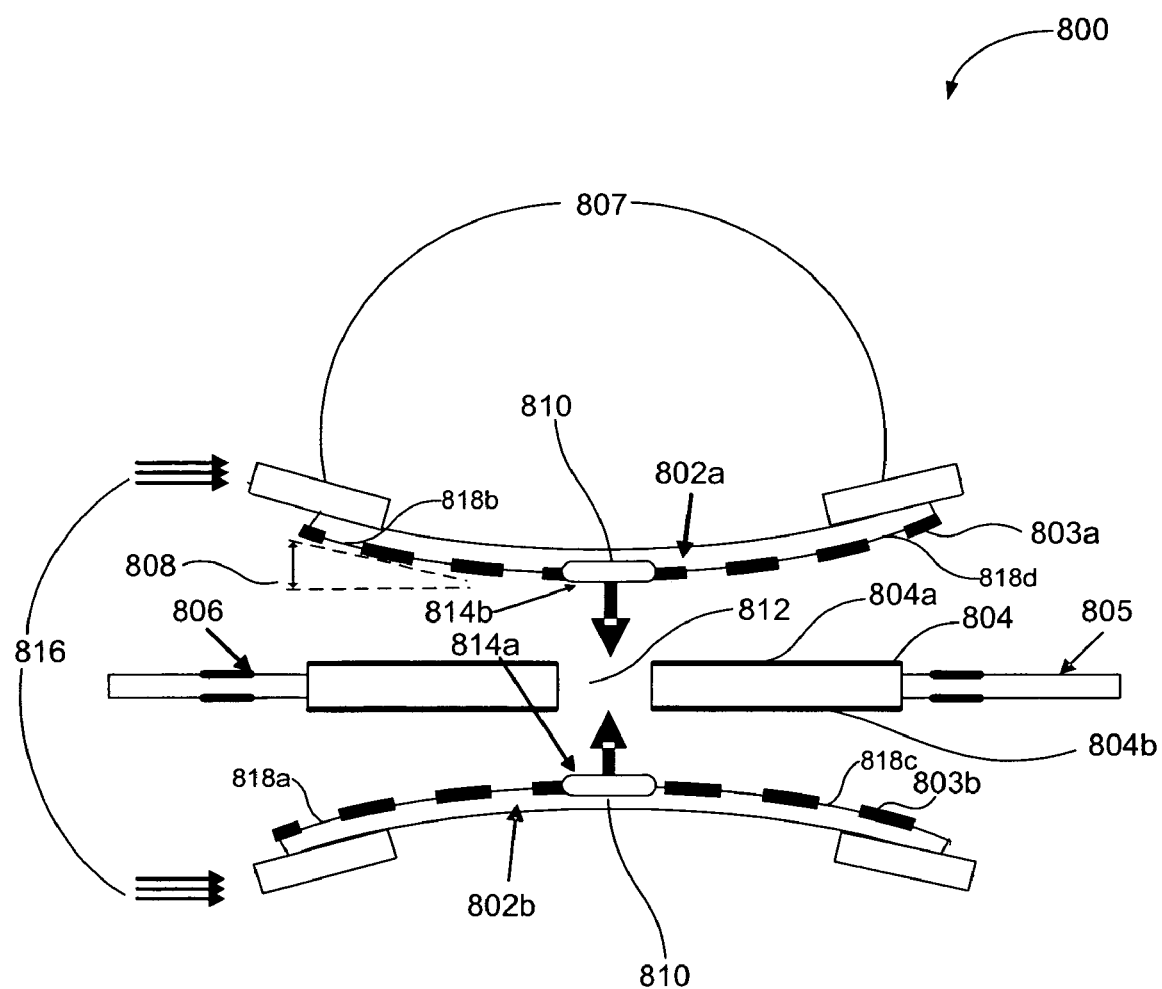

FIG. 8 is an illustration of an exemplary apparatus including two imprint stamps and a double-sided substrate arranged in accordance with an embodiment of the present invention.

Figure 9:
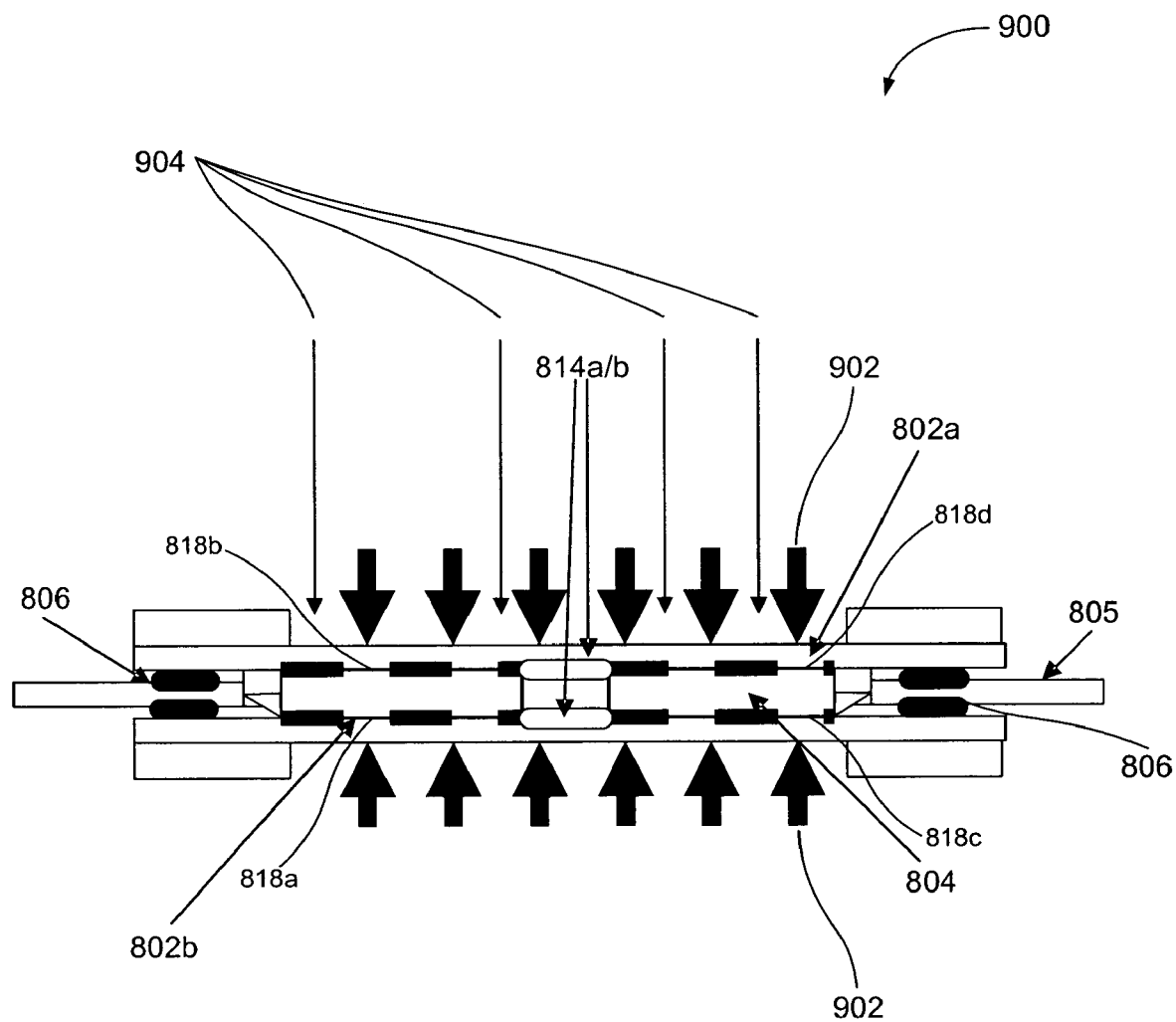

FIG. 9 is an illustration of the stamps and substrate illustrated in FIG. 8 being exposed to optional ultra-violet (UV) radiation (UV exposure not required for thermal imprints) and applied pressure.

Figure 10:
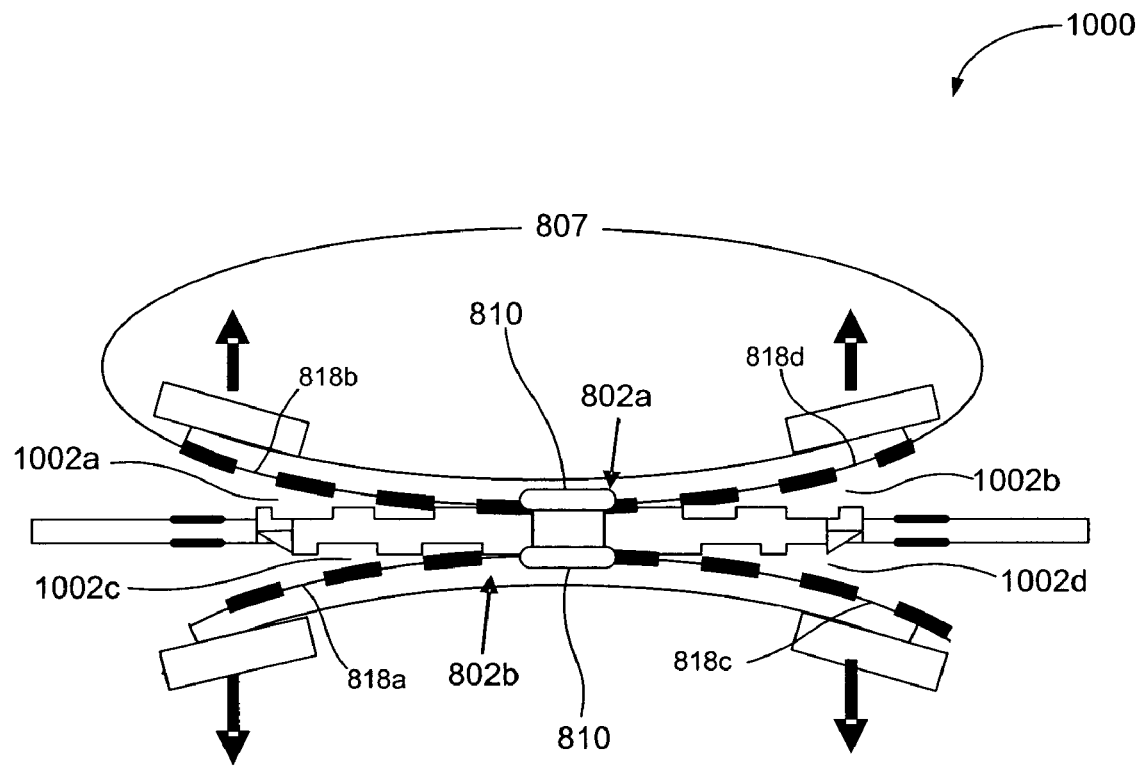

FIG. 10 is an illustration of the stamps being separated from the resin in accordance with the present invention.

Figure 11:
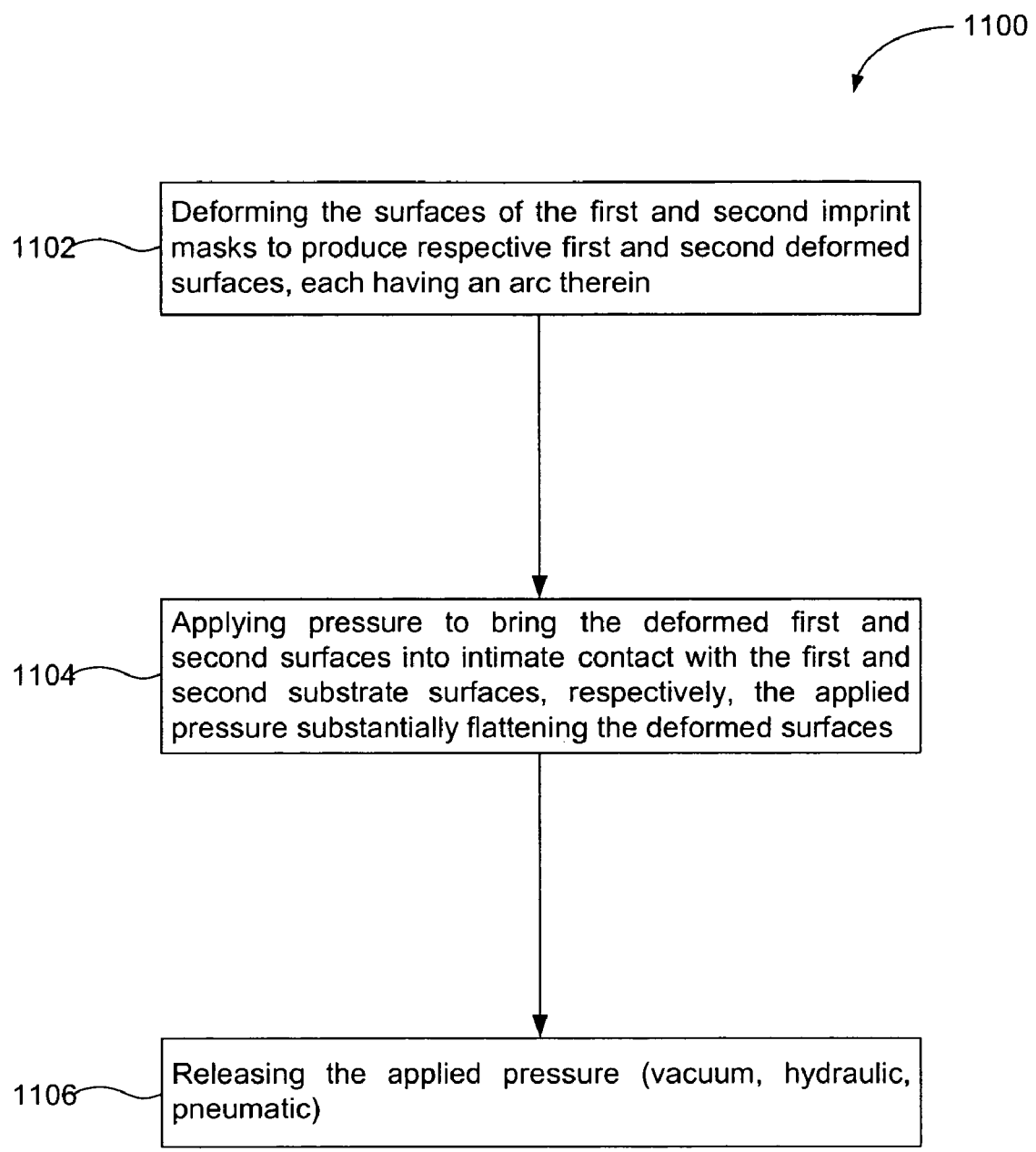

FIG. 11 is a flowchart of an exemplary method of practicing an embodiment of the present invention.

DETAILED DESCRIPTION

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware and/or the entities illustrated in the drawings. Thus, the operation and behavior of the present invention will be described with the understanding that modifications and variations of the embodiments are possible, given the level of detail presented herein.

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
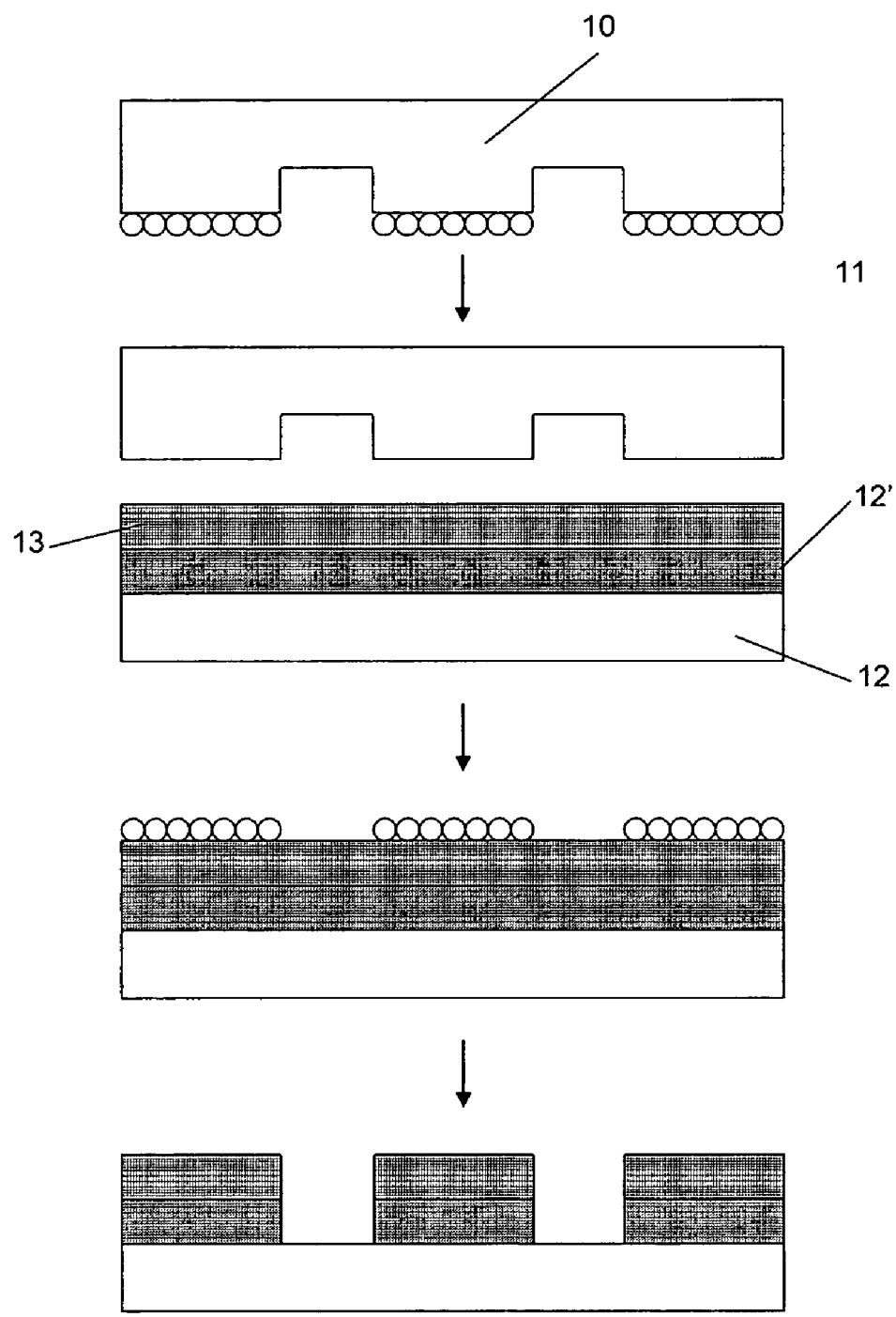
FIGS. 1a-1c illustrate examples of conventional soft, hot and UV lithography processes, respectively.
Figure 1B:
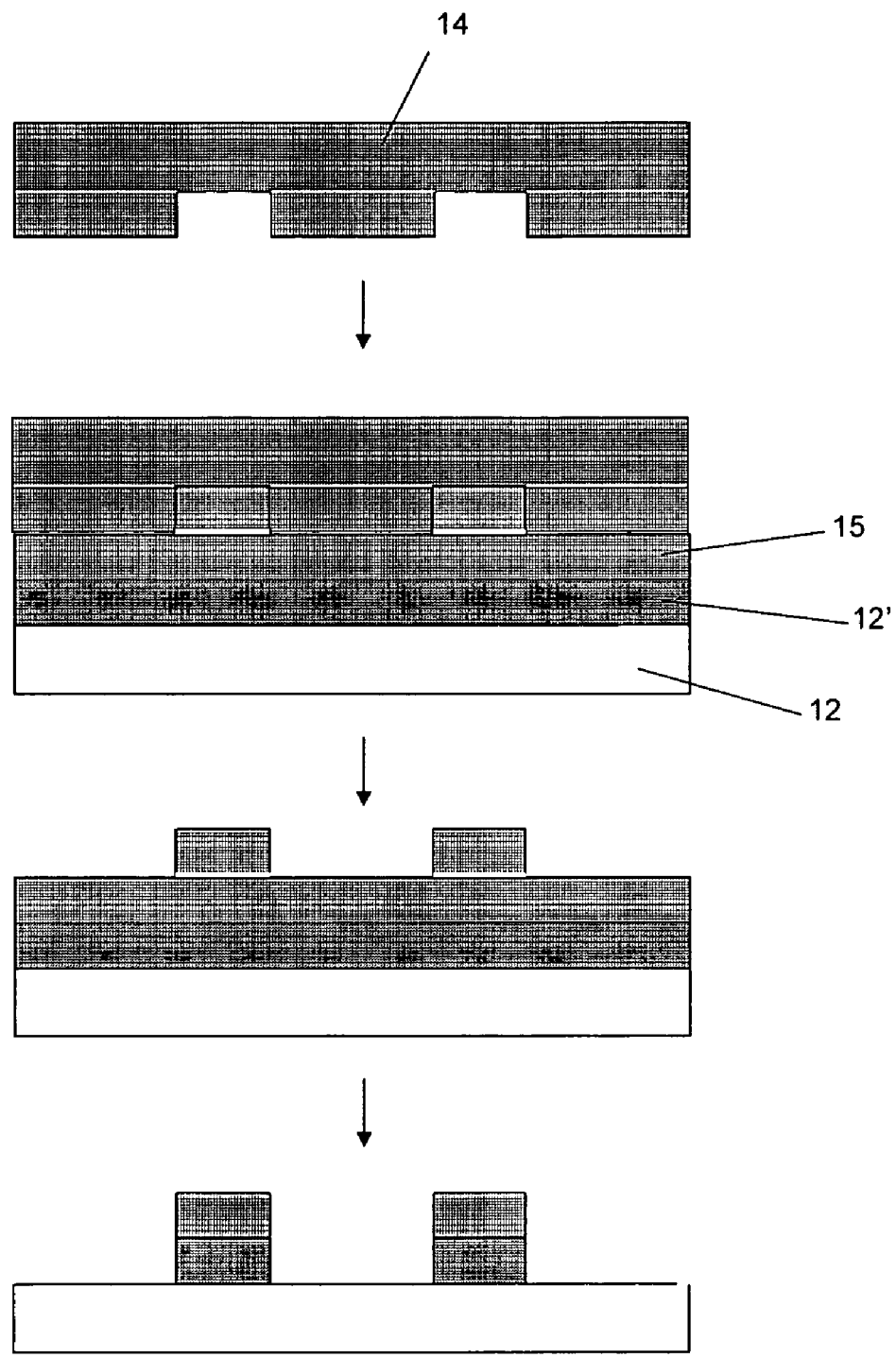
Figure 1C:
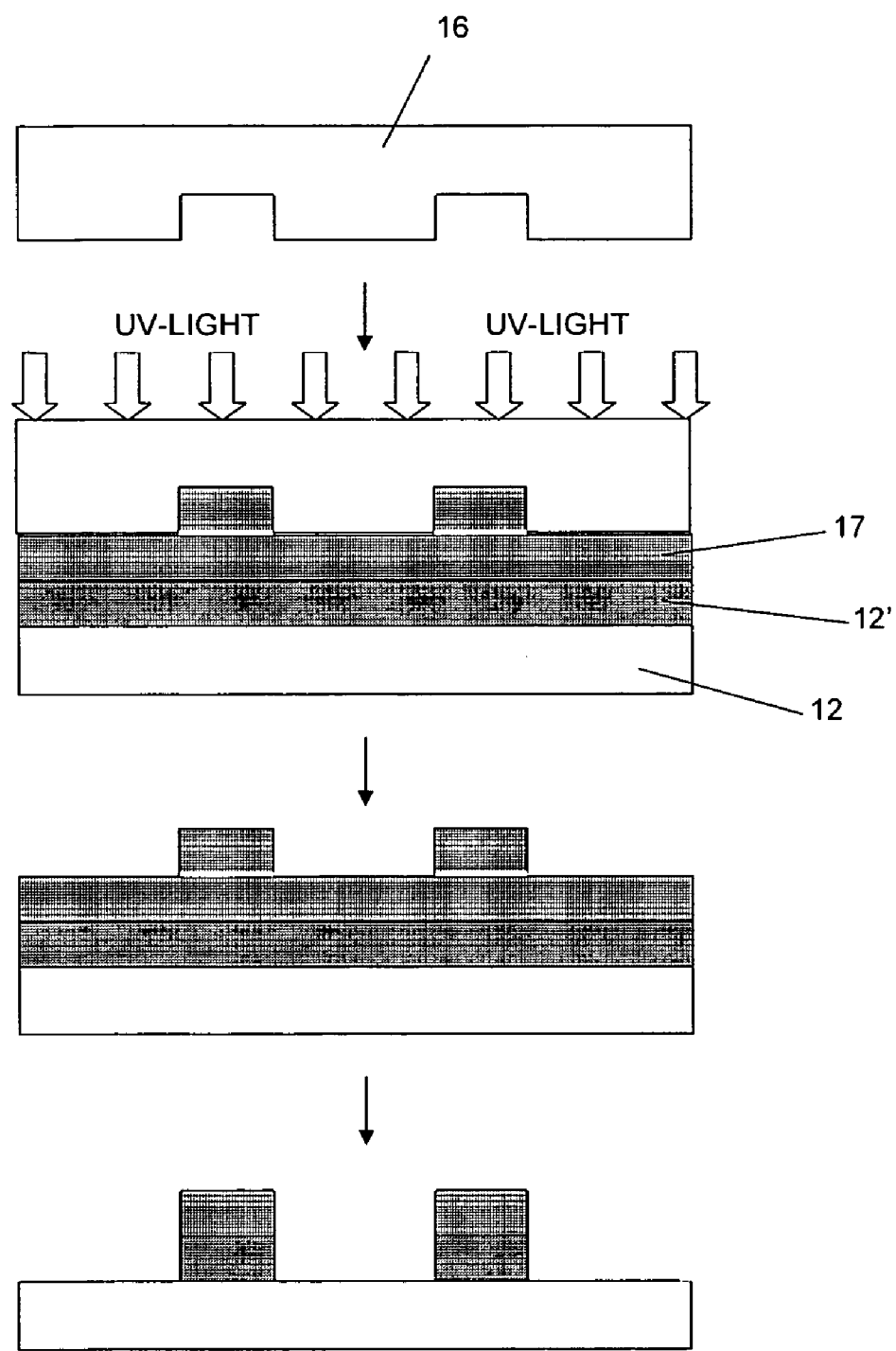

FIG. 1a shows the soft lithography process that involves transferring a layer of molecules 11 (typically an ink such as a thiol) from a flexible template 10 (typically fabricated from polydimethylsiloxane (PDMS)) onto a resist layer 13 that is supported upon a substrate 12 and planarization and transfer layer 12'. The template 10 has a pattern of features on its surface, the molecular layer being disposed upon the features. When the template is pressed against the resist layer the layer of molecules 11 stick to the resist. Upon removal of the template from the resist the layer of molecules 11 stick to the resist and the residual layer of resist is etched, such that the areas of the resist not covered by the transferred molecular layer are etched down to the substrate.

The template used in soft lithography can be easily deformed and can therefore not be suited to high-resolution applications, e.g., on a nanometer scale, since the deformation of the template can adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses harder templates made from, for example, silicon or nickel, which are more resistant to wear and deformation. This is described, for example, in U.S. Pat. No. 6,482,742 and illustrated in FIG. 1b of the instant application.

In a typical hot imprint process a solid template 14 is imprinted into a thermosetting or a thermoplastic polymer resin 15, which has been cast on the surface of a substrate 12. The resin can, for example, be spin coated and baked onto the substrate surface or more typically (as in the example illustrated) onto a planarization and transfer layer 12'. It shall be understood that the term "hard" when describing an imprint template includes materials that can generally be considered between "hard" and "soft" materials, such as for example "hard" rubber. The suitability of a particular material for use as an imprint template is determined by its application requirements.

When a thermosetting polymer resin is used the resin is heated to a temperature such that, upon contact with the template, the resin is sufficiently flowable to flow into the pattern features defined on the template. The temperature of the resin is then increased to thermally cure (e.g., crosslink) the resin so that it solidifies and irreversibly adopts the desired pattern. The template can then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resins to temperatures considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin that can then be removed by an appropriate etch process to leave only the pattern features.

Figure 2:
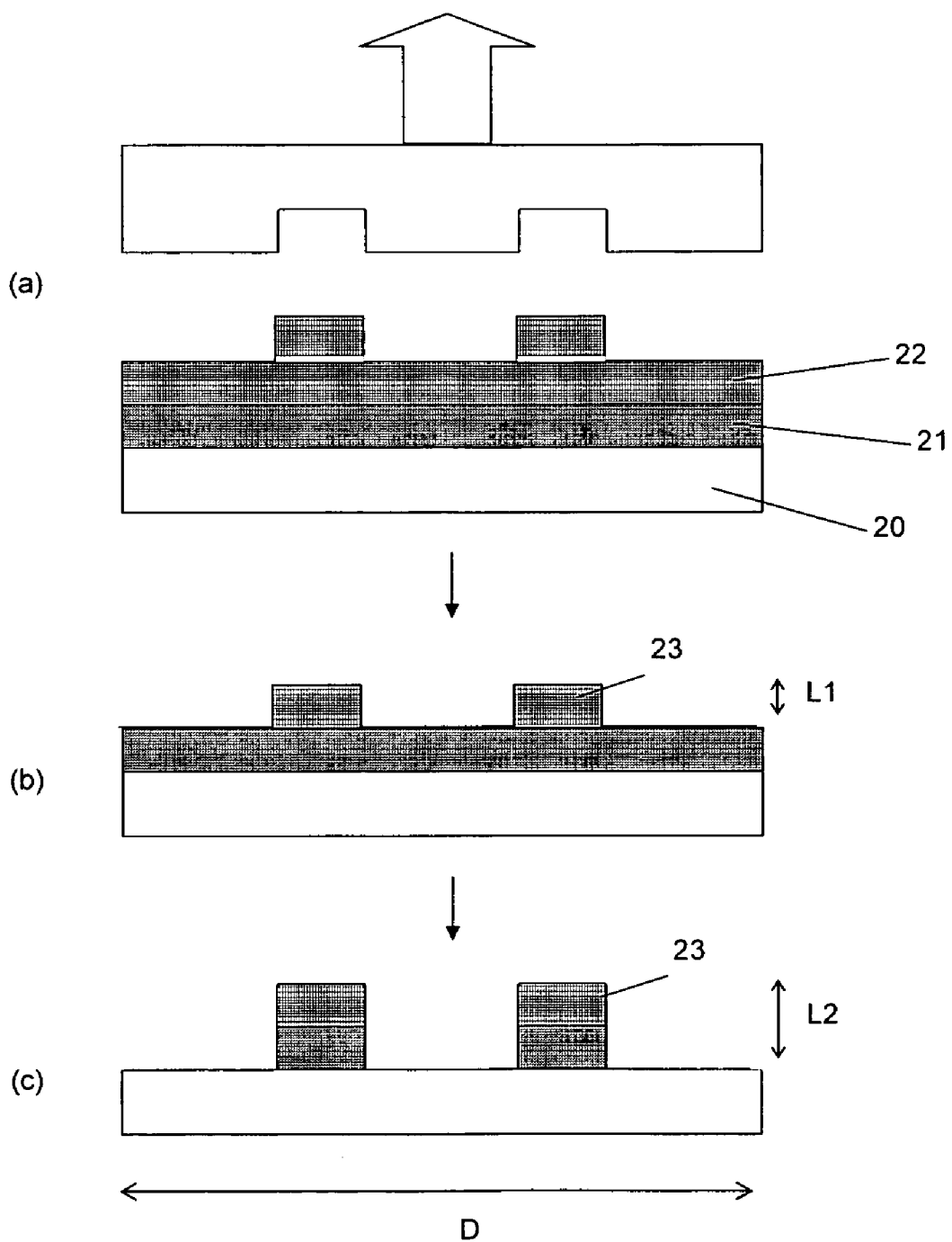
FIG. 2 illustrates a two-step etching process employed when hot and UV imprint lithography is used to pattern a resist layer.

Upon removal of the template from the solidified resin, a two-step etching process is performed as illustrated in FIGS. 2a to 2c. The substrate 20 has a planarization and transfer layer 21 upon it, as shown in FIG. 2a. The purpose of the planarization and transfer layer is twofold. It acts to provide a surface parallel to that of the template, which is important to ensure that the contact between the template and the resin is parallel, and also to improve the aspect ratio of the printed features, as will be described below.

After the template has been removed, a residual layer 22 of the solidified resin is left on the planarization and transfer layer, shaped in the desired pattern. The first etch is isotropic and removes parts of the residual layer, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer which are not covered by the solidified resin, increasing the aspect ratio of the features 23 to (L2/D), as shown in FIG. 2c. The resulting polymer thickness contrast left on the substrate after etching can be used as, for example, a mask for dry etching if the imprinted polymer is sufficiently resistant, for example, as a step in a lift-off process.

Hot imprint lithography suffers from a disadvantage in that not only is the pattern transfer be performed at a higher temperature, but also relatively large temperature differentials might be required in order to ensure the resin is adequately solidified before the template is removed. Temperature differentials between about 35 and about 100° C. are known from literature. Differential thermal expansion between, for example, the substrate and template, can then lead to distortion in the transferred pattern. The problem is exacerbated by the relatively high pressures used for the imprinting step, due the viscous nature of the imprintable materials, which can induce mechanical deformation in the substrate, again distorting the pattern.

UV imprint lithography on the other hand does not involve such high temperatures and temperature changes. Nor does it require such viscous imprintable materials. Rather UV imprint lithography involves the use of a transparent template and a UV-curable liquid, typically a monomer such as an acrylate or methacrylate for example. In general any photopolymerisable material could be used, such as a mixture of monomers and an initiator. The curable liquid can also, for example, include a dimethyl siloxane derivative. Such materials are much less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV-curable resin 17 in a similar manner to the process of FIG. 1b. Instead of raising the temperature as in hot embossing employing thermosetting resins, or temperature cycling when using thermoplastic resins, UV light is applied to the resin through the quartz template in order to polymerize and thus cure it. Upon removal of the template, the remaining steps of etching the residual layer of resist are the same as for the hot embossing process described above. The UV curable resins typically used have a much lower viscosity than typical thermoplastic resins so that lower imprint pressures are used. Reduced physical deformation due to the lower pressures, together with reduced deformation due to high temperatures and temperature changes, makes UV imprint lithography better suited to application requiring high overlay accuracy. In addition, the transparent nature of UV imprint templates can accommodate optical alignment techniques simultaneously to the imprint.

Although this type of imprint lithography mainly uses UV curable materials, and is thus generically referred to as UV imprint lithography, other wavelengths of light can be used to cure appropriately selected materials (e.g., activate a polymerization or cross-linking reaction). In general any radiation capable of initiating such a chemical reaction can be used if an appropriate imprintable material is available. Alternative "activating light" can, for example, include visible light, infrared light, x-ray radiation, and electron beam radiation. In the general description above, and below, references to UV imprint lithography and use of UV light are not intended to exclude these and other activating light possibilities.

As an alternative to imprint systems using a planar template that is maintained substantially parallel to the substrate surface, roller imprint systems have been developed. Both hot and UV roller imprint systems have been proposed in which the template is formed on a roller, but otherwise the imprint process is very similar to imprinting using a planar template. Unless the context requires otherwise, references to an imprint template include references to roller templates.

There is a particular development of UV imprint technology known as step and flash imprint lithography (SFIL), which can be used to pattern a substrate in small steps in a similar manner to optical steppers conventionally used in IC manufacture. This involves printing small areas of the substrate at a time by imprinting a template into a UV curable resin, 'flashing' UV light through the template to cure the resin beneath the template, removing the template, stepping to an adjacent region of the substrate and repeating the operation. The small field size of such step and repeat processes minimizes pattern distortions CD variations so that SFIL is particularly suited to manufacture of IC and other devices requiring high overlay accuracy.

Although in principle the UV curable resin can be applied to the entire substrate surface, for example, by spin coating, this is problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid can be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features, while at the same time minimizing excess resin which can be rolled to an undesirably thick or uneven residual layer since as soon as neighboring drops touch fluid the resin will have nowhere to flow. The problems associated with overly thick or uneven residual layer are discussed below.

FIG. 3 illustrates the relative dimensions of the template, imprintable material (e.g., curable monomer, thermosetting resin, thermoplastic, etc) and substrate. The ratio of the width of the substrate, D, to the thickness of the curable resin layer, t, is of the order of about $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned above it is also the source of a number of problems particularly when high resolution and/or overlay accuracy is desired. The first 'breakthrough' etch is isotropic (e.g., non-selective), and will thus to some extent erode the features imprinted as well as the residual layer. This is exacerbated if the residual layer is overly thick and/or uneven.

This problem can, for example, lead to variation in the thickness of lines ultimately formed in the underlying substrate (i.e., variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process.

In principle, the above problem can be reduced by ensuring the residual layer is as thin as possible but this can require application of undesirably large pressures (e.g., increasing substrate deformation) and relatively long imprinting times (e.g., reducing throughput).

The template is a significant component of the imprint lithography system. As noted above, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high-resolution pattern in resist. The resist pattern is then transferred into a thin layer of chrome which forms the mask for the final, anisotropic etch step to transfer the pattern into the base material of the template. Other techniques, such as, for example, but not limited to, ion-beam lithography, X-ray lithography, extreme UV lithography, epitaxial growth, thin film deposition, chemical etching, plasma etching, ion etching, or ion milling could be used. Generally, a technique capable of very high resolution will be desired as the template is effectively a 1× mask with the resolution of the transferred pattern being limited by the resolution of the pattern on the template.

The release characteristics of the template can also be an important consideration. The template can, for example, be treated with a surface treatment material to form a thin release layer on the template having a low surface energy (a thin release layer can also be deposited on the substrate).

Although reference is made above to depositing UV curable liquids onto a substrate, the liquids could also be deposited on the template and in general the same techniques and considerations will apply.

Another important consideration in the development of imprint lithography is the mechanical durability of the template. The template is subjected to large forces during stamping of the resist, and in the case of hot lithography, it is also subjected to extremes of pressure and temperature. This will cause wearing of the template, and can adversely affect the shape of the pattern imprinted upon the substrate.

In hot imprint lithography there are potential advantages in using a template of the same or similar material to the substrate to be patterned in order to minimize differential thermal expansion between the two. In UV imprint lithography the template is at least partially transparent to the activation light, and accordingly quartz templates are used.

Although specific reference can be made in this text to the use of imprint lithography in the manufacture of ICs, it should be understood that imprint apparatus and methods described can have other applications, such as the manufacture of integrated optical systems, guidance and detection patterns for magnetic domain memories, hard disc magnetic media, flat panel displays, thin-film magnetic heads, etc.

While in the description above particular reference has been made to the use of imprint lithography to transfer a template pattern to a substrate via an imprintable resin effectively acting as a resist, in some circumstances the imprintable material can itself be a functional material, for example, having a functionally such as conductivity, optical linear or non linear response amongst others. For example, the functional material can form a conductive layer, a semiconductive layer, a dielectric layer or a layer having another desirable mechanical, electrical or optical property. Some organic substances can also be appropriate functional materials. Such applications can be within the scope of an embodiment of the present invention.

Exemplary Transport of Substrate for Double Sided Patterning

FIG. 4 shows a portion of an imprint lithography system, according to one embodiment of the present invention. In this portion, a carrier 400 is used to transport a substrate 402 from one location of a lithography tool (not shown), e.g., an imprint lithography tool, to another location of the lithography tool. For example, substrate 402 can be transported for patterning, as is described in more detail above and below. In this embodiment, substrate 402 includes first and second resin surfaces 404 and 406, which can both be patterning surfaces. Thus, in order to avoid disrupting the patterning surfaces 404 and 406 during transport, substrate 402 is contacted on its edge 408 by holding portions 410 of carrier 400. To securing hold substrate 402 during transport, a shape of edge 408 is formed to be complementary with a shape of holding portion 410, while allowing for edge 408 to be supported by holding portions 410. Various exemplary shapes are shown in FIGS. 5, 6, and 7 below.

FIGS. 5, 6, and 7 show various complementary shapes for substrate edge 408 and carrier holding portions 410, according to various embodiments of the present invention. These are meant to be exemplary, and not exhaustive.

FIG. 5 shows a substrate 502 having a single beveled edge 508 being held by a holding portion 510 of a carrier 500 having a complementary single beveled shape, such that carrier 500 does not touch patterning surfaces 504 and 506 during transport.

FIG. 6 shows a substrate 602 having a double beveled edge 608 being held by a holding portion 610 of a carrier 600 having a complementary double beveled shape, such that carrier 600 does not touch patterning surfaces 604 and 606 during transport.

FIG. 7 shows a substrate 702 having a stepped edge 708 being held by a holding portion 710 of a carrier 700 having a complementary stepped shape, such that carrier 700 does not touch patterning surfaces 704 and 706 during transport.

Exemplary Double Sided Patterning of Substrate

In an exemplary embodiment of the present invention, a curvature or bow is created in the imprint stamp that allows the stamp to be separated from the resin (substrate) with an unzipping action. Once separated from the stamp, the substrate can be unloaded from the apparatus in an undamaged state. The curvature or bow is instrumental in providing a clean separation of the stamp and substrate, particularly on larger substrates.

FIG. 8 is an illustration of an exemplary apparatus 800 including imprint stamps 802a/802b and a double sided substrate (e.g., a resin coated patterned media disc substrate) 804, arranged in accordance with an embodiment of the present invention. The substrate 804 can be held in place, for example, by a patterned media carrier plate 805. In FIG. 8 the imprint stamps 802a and 802b can be nano-plate imprint stamps (i.e., having nano-scale features on the orders of several nanometers line width), although other types of imprint stamps can be used.

Uses and manufacturing of nano-plate imprint stamps are described in U.S. patent application entitled METHOD AND SYSTEM FOR MAKING A NANO-PLATE FOR IMPRINT LITHOGRAPHY, application Ser. No. 11/012,489, filed Dec. 16, 2004 and U.S. patent application entitled METHOD AND SYSTEM FOR MAKING A COMPUTER HARD DRIVE PLATEN USING A NANO-PLATE, application Ser. No. 11/012,474, filed Dec. 16, 2004, both of which are assigned to the assignee of the present invention and are incorporated herein by reference. The imprint stamps 802a and 802b respectively include patterns 803a and 803b that are to be printed onto respective sides 804a/804b of the substrate 804.

Each of the imprint stamps 802a and 802b is clamped in such a way as to create a bow in the stamp profile. In the embodiment of FIG. 8, the imprint stamps 802a and 802b are held by a vacuum seal 806 against vacuum lands 807 that are out of planar. Deviation 808 from planar is quite small, but is sufficient to deviate a center portion 810 of the stamps 802a and 802b, many microns out of flat. This bow or curvature, that has been introduced in the stamp ensures that when each of the stamps 802a and 802b and the respective sides 804a/804b of the substrate 804 are brought together, it is the center portion 810 of the stamps 802a and 802b that makes contact with respective sides 804a/804b of the substrate 804, first.

In one example, stamps 802a and 802b can be clamped flat onto substrate 804 and the bowing can be produced by gas pressure (e.g., air or nitrogen) being exerted behind a plate of each of the stamps 802a and 802b to release stamps 802a and 802b from substrate 804.

In one embodiment, the bow introduced in stamp 802a is substantially equal to the bow introduced in stamp 802b. In another embodiment, the amount of bowing can be different in each stamp.

In the exemplary embodiment of FIG. 8, the substrate 804 has a bore 812 through its center. Respective alignment markers 814a and 814b are provided as reference points for precisely aligning each of the stamps 802a and 802b respectively, to the center bore 812 of the substrate 804. A positioning and alignment system 816 can then be used to perform the actual alignment of the markers 814a and 814b to the bore 812. Alignment can be accomplished, for example, by first aligning the marker 814a with the marker 814b. Next, the bore 812 can be aligned with the previously aligned markers 814a and 814b. The positioning and alignment system 816 can be selected from a number of different lithography alignment tools.

In another example, alignment can be performed based on alignment marks 818a-d, where alignment is made between alignment marks 818a and 818b and between 818c and 818d.

As a final check and to provide a means of more finely tuning ongoing alignments, a viewing system can then be used to view the alignment markers 814 and the bore 812 during the alignment process.

FIG. 9 is an illustration 900 of the stamps 802a/802b and the substrate 804, shown in FIG. 8. In FIG. 9, the stamps 802a/802b and the substrate 804 are shown under application of force 902 and exposure to optional ultra-violet (UV) radiation 904. That is, during an actual imprinting procedure, the stamps 802a/802b and respective sides of the substrate 804, are simultaneously pressed together with enough force 902 to conform the side 804a to the stamp 802a and the 804b to the stamp 802b, together in intimate contact. The applied force or pressure can result from a vacuum, hydraulic, pneumatic means, electrostatic, electromagnetic, or by a combination of some or all of these techniques.

Effectively, the bows formed in each of the stamps 802a and 802b, are substantially flattened out by a clamping pressure. Further clamping pressure can be applied using the vacuum seals 814. The vacuum seals are provided to create a vacuum cavity between the sides 804a and 804b of substrate 804 and the imprint stamps 802a and 802b, respectively.

The pressure and temperature of the stamping process is controlled to provide high quality pattern transfer. The entire apparatus is enclosed in a chamber which provides temperature control. The temperature of the apparatus including the substrate is controlled to a temperature defined by the requirements of the process conditions of the applied resin.

Transfer of the patterns 803a and 803b into the respective sides 804a and 804b can be further facilitated by optionally flood exposing, for example, a UV-cure type resin with UV light 904 through each of the imprint stamps 802a and 802b and into the surfaces 804a and 804b of the substrate 804, respectively. The UV exposure 904 cross-links the resin coated substrate 804 and helps to solidify the resin.

Although FIG. 9 provides an illustration of a UV-curable resin coated substrate, the present invention is not limited to this approach. For example, the principle of deforming the imprint stamps 802a and 802b with an arc or bow is also applicable using a thermal resin. With thermal resin, the substrate and imprint mask are brought together at an elevated temperature which is sufficient to soften the resin.

When softened through heating, the patterns 803a and 803b from the imprint stamps 802a and 802b respectively, can be physically pressed into the softened sides 804a and 804b of the resin 804 by applying the force/pressure 902. Using a thermal resin, no U-V exposure is required to cure the resin. Both the stamps 802a and 802b, and the substrate 804 are typically heated and temperature controlled in the case of thermal imprinting.

FIG. 10 is an illustration 1000 of the imprint stamps 802a and 802b being separated from the respective sides 804a and 804b of the substrate 804, in accordance with an embodiment of the present invention. The release of the vacuum and reduction of the pressure 902 between the stamps 802a and 802b and the respective sides 804a and 804b initiates the separation process. The imprint stamp 802a begins to separate from the substrate side 804a and the imprint stamp 802b begins to separate from the substrate side 804b. This separation begins first as a peeling apart at the outer edge 1002a-1002d.

In another embodiment, stamps 802a and 802b have central apertures in them. A ball or curvature is introduced in these stamps 802a/802b to facilitate separation between stamps 802a/802b and substrate 804. In a still further embodiment, stamps 802a/802b can be, but are not limited to, square or disk shaped.

The separation progresses to the center portion 810 of the substrate 804 in a carefully controlled manner as the pressure is fully released. There is an unzipping, or peeling back action, as opposed to a straight pull off, to separate the sides 804a and 804b from the imprint stamps 802a and 802b, respectively. This action is essential to the keeping of nanometer sized imprinted patterns transferred to the substrate 804 in place and undamaged. Once separated from the imprint stamp 802a and 802b, the substrate sides 804a and 804b can be unloaded from the apparatus 800.

In one example, release agent material can be formed on the stamps or resin surface to further aid the release of the stamps from the resin.

FIG. 11 is a flowchart of an exemplary method 400 of practicing an embodiment of the present invention. In FIG. 11, first and second surfaces of an imprint stamp are deformed to produce respective first and second deformed surfaces, each having an arc therein, as indicated in step 1102. In step 1104, a pressure is applied to bring the deformed first and second surfaces into intimate contact with first and second substrate surfaces respectively, the applied pressure substantially flattening the deformed surface. To separate the two surfaces, the applied pressure is released, as indicated in step 1106.

In one example, the patterning of the first and second sides of the substrate is performed substantially simultaneously.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method for providing patterns formed on first and second continuous surfaces of respective first and second imprint stamps onto first and second surfaces of a substrate, the method comprising:
   (a) coupling at least one of the first and the second imprint stamps to a non-planar supporting structure, deforming at least one of the first and second continuous surfaces of the respective first and second imprint stamps to produce a continuous deformed surface;
   (b) aligning the continuous deformed surface with a corresponding one of the first and second substrate surfaces;
   (c) applying external pressure to flatten the non-planar supporting structure, conforming the continuous deformed surface into intimate contact with the corresponding one of the first and second substrate surfaces for transferring the pattern from the continuous deformed surface to the corresponding one of the first and second substrate surfaces; and
   (d) releasing the continuous deformed surface from the corresponding one of the first and second substrate surfaces.

2. The method of claim 1, wherein step (c) comprises using at least one of a vacuum pressure, hydraulic pressure, electromagnetic clamping, electrostatic clamping, and pneumatic pressure to conform the continuous deformed surface with the corresponding one of the first and second substrate surfaces.

3. The method of claim 1, wherein steps (c) and (d) comprise:
   using a vacuum pressure and at least one of a hydraulic pressure and a pneumatic pressure,
   wherein when the hydraulic pressure or the pneumatic pressure is released the continuous deformed surface remains in intimate contact with the corresponding one of the first and second substrate surfaces until the vacuum pressure is released.

4. The method of claim 3, wherein release of the vacuum pressure initiates an unzipping action between the continuous deformed surface and the corresponding one of the first and second substrate surfaces.

5. The method of claim 1, wherein the method further comprises:
   aligning vertices of arcs of first and second continuous deformed surfaces opposite to each other, when both the first and second continuous surfaces of the respective first and second imprint stamps are deformed to create the arcs.

6. The method of claim 1, further comprising exposing the substrate to ultra-violet light prior to step (d).

7. The method of claim 1, further comprising:
   heating at least one of the first and second continuous surfaces of the respective first and second imprint stamps and the first and second substrate surfaces.

8. The method of claim 5, wherein the first and the second continuous deformed surfaces are brought into intimate contact with corresponding first and second surfaces of the substrate substantially simultaneously.

9. An apparatus for providing patterns formed on first and second continuous surfaces of respective first and second imprint stamps onto first and second sides of a substrate, the apparatus comprising:
   a non-planar supporting structure configured to be coupled to at least one of the first and the second imprint stamps for deforming at least one of the first and second continuous surfaces to create a continuous deformed surface;
   an alignment device for aligning the continuous deformed surface with a corresponding one of the first and second sides of the substrate;
   a clamping device configured to apply external pressure to flatten the non-planar supporting structure so that the pattern is transferred to the corresponding one of the first and second sides of the substrate by conforming the continuous deformed surface into intimate contact with the corresponding one of the first and second sides of the substrate; and
   a releasing device configured to release the applied external pressure to initiate separation of the continuous deformed surface from the substrate.

10. The apparatus of claim 9, wherein arcs created by deforming both the first and second continuous surfaces of the respective first and second imprint stamps have opposing vertices aligned to each other.

11. The apparatus of claim 9, further comprising:
an exposing device that exposes the substrate to ultraviolet light.

12. The apparatus of claim 9, further comprising:
a heating device that heats at least one of the first and second sides of the substrate and the first and second continuous surfaces of the first and second imprint stamps.

13. The apparatus of claim 9, wherein a clamping pressure deforms the first and second continuous surfaces of the respective first and second imprint stamps.

14. The apparatus of claim 9, wherein the first and second imprint stamps have at least one of a rectilinear or circular shape.

15. The method of claim 1, wherein prior to step (a), the method further comprises:
forming alignment features on the first and second continuous surfaces of the respective first and second imprint masks, such that the first and the second continuous surfaces can be aligned to each other or to the substrate.

16. The method of claim 1, wherein prior to step (c), the method further comprises:
(1) coupling the substrate to a substrate carrier; and
(2) providing a mechanism on the substrate carrier to couple to the non-planar supporting structures when external pressure is applied.

17. The apparatus of claim 9, wherein the substrate is coupled to a substrate carrier.

18. The apparatus of claim 17, wherein an edge of the substrate and the substrate carrier have complementary shapes to facilitate coupling of the substrate to the substrate carrier.

19. The apparatus of claim 17, wherein the substrate carrier comprises a mechanism to couple to the non-planar supporting structure.

20. The apparatus of claim 19, wherein the non-planar supporting structure comprises vacuum lands, and the mechanism that couples the substrate carrier to the non-planar supporting structure comprises vacuum seals.

21. The apparatus of claim 17, wherein the substrate carrier is configured to facilitate alignment of the substrate relative to the first and second continuous surfaces of the respective first and second imprint stamps.

22. The apparatus of claim 9, wherein the first and second continuous surfaces of the respective first and second imprint stamps have alignment features patterned onto them.

* * * * *